March 17, 1964 J. J. TIEMANN 3,125,685

NONLINEAR SENSING CIRCUIT

Filed Dec. 31, 1959

Inventor:
Jerome J. Tiemann,
by John F. Ahern
His Attorney.

United States Patent Office 3,125,685
Patented Mar. 17, 1964

3,125,685
NONLINEAR SENSING CIRCUIT

Jerome J. Tiemann, Burnt Hills, N.Y., assignor to General Electric Company, a corporation of New York
Filed Dec. 31, 1959, Ser. No. 863,142
7 Claims. (Cl. 307—88)

This invention relates to sensing circuits and in particular to such circuits utilizing semiconductor devices.

While this invention has a wide range of applications in various electrical and electronic systems it is especially suited for application in the fields of regulation, protection and control.

The semiconductor device used in the practice of this invention is a narrow junction degenerate semiconductor diode. By a "degenerate semiconductor" is meant a body of semiconductor to which has been added a sufficient concentration of excess donor impurity to raise the Fermi-level for electrons to a higher energy than the conduction band edge; or to which has been added a sufficient concentration of excess acceptor impurity to depress the Fermi-level to a lower energy than the valence band edge.

When a device is formed having such degenerate semiconductor on both sides of the P-N junction, respectively, the device exhibits a region of strong negative resistance at the low forwad voltage range of its current-voltage characteristic. This negative resistance region is in the forward voltage range of generally less than 1 volt. Such a device is referred to herein as a narrow junction semiconductor diode device.

For further details concerning the semiconductor device used in the practice of this invention reference may be had to my copending application, Serial No. 74,815, filed December 12, 1960, which is a continuation-in-part of my application Serial No. 858,995, filed December 11, 1959, and now abandoned, the entire disclosure of which is incorporated herein by reference; said application being assigned to the assignee of the present application.

It is an object of this invention to provide a sensitive and efficient current threshold sensing circuit using a narrow junction degenerate semiconductor diode device.

It is another object of this invention to provide a sensing circuit having extremely low power consumption.

It is another object of this invention to provide a sensing circuit which operates on power from the circuit whose electrical condition is to be sensed, and the circuit itself requires no additional power supply.

It is another object of this invention to provide an improved threshold sensing circuit which allows for a reduction in circuit components.

It is still another object of this invention to provide a sensitive tolerance limit circuit.

Briefly stated, in accord with one aspect of this invention, the sensing circuit, responsive to a predetermined electrical condition in a circuit to be sensed, comprises a circuit loop including a narrow junction degenerate semiconductor diode, a resistance and a first inductive element. The narrow junction diode exhibits a characteristic peak current, a negative resistance characteristic and a first and second stable static impedance condition at low forward voltages. A second inductive element is inductively coupled to the first inductive element and is adapted for taking an electrical output therefrom. Means are provided for connecting one side of a circuit, an electrical characteristic of which is to be sensed, to the juncture of the diode and the resistance, and the other side of the circuit to an intermediate portion of the first inductance element. The resistance element has an impedance value higher than the static impedance of the diode at diode voltages lower than the voltage corresponding to the diode peak current, but lower than the static impedance of the diode at voltages higher than the voltage corresponding to the diode peak current on the diode current-voltage characteristic. Whenever the current through the diode reaches the characteristic diode peak current the diode abruptly switches from its first stable low impedance condition to a second stable high impedance condition causing a change in current in the first inductive element and inducing an output at the second inductive element.

For a better understanding of the present invention together with other and further objects thereof, reference may be had to the following description taken in connection with the accompanying drawings and its scope will be pointed out in the appended claims.

Figure 1:
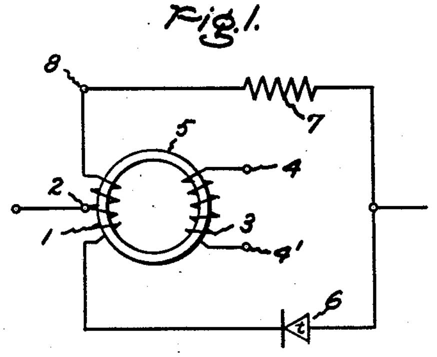
FIG. 1 is a schematic illustration of one embodiment of this invention.

Referring now to FIG. 1, there is shown a schematic diagram of a current threshold sensing circuit in accord with one embodiment of this invention. Since voltage and current are interrelated this circuit may, however, be utilized to sense a threshold voltage as well.

The circuit comprises inductance element 1 having an intermediate tap which may, for example, be a center tap 2 for connection to a current source, the threshold value of which is to be sensed. Inductance 1 may be a winding of any desired number of turns, for example. Inductance element 1 is inductively coupled to inductance element 3 having means such as terminals 4—4', for taking an output therefrom. While the magnetic coupling between inductance 1 and 3 may be through air, it may be preferred, in order to obtain a greater and more desirable output, that a core 5 be used. For example, core 5 may be of transformer iron, non-metallic magnetic material, such as a ferrite, or any material having magnetic permeability to provide the desired coupling between inductive elements 1 and 3.

One end of inductance element 1 is connected to diode 6 and the other end is connected to resistance 7. The other terminals of diode 6 and resistance 7 are connected together to the other side of the current source. Thus, diode 6 and resistance 7 are in parallel circuit relationship and the voltage is the same across both elements. The IR voltage across diode 6 due to the current is in the direction to bias diode 6 in a forward direction.

The above elements are all that are required in this novel sensing circuit. Since no power supply for the sensing circuit itself is required the only power required is that which is dissipated in the resistance and the diode in addition to the other usual circuit losses. This power is extremely low as compared to the amount of current which may be flowing in the circuit, the condition of which is to be sensed. For example, in a circuit breaker application a current of 1000 amperes may be interrupted whenever a predetermined threshold value has been exceeded with the consumption of only approximately 50 watts.

Figure 2:
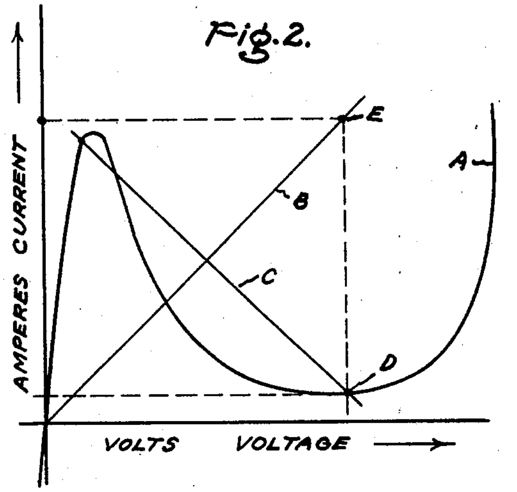
FIG. 2 illustrates a typical current-voltage characteristic of a narrow junction degenerate semiconductor diode suitable for use in the practice of this invention.

The operation of the sensing circuit of FIG. 1 may best be described by reference to FIG. 2 which illustrates the current-voltage characteristics of both narrow junction diode 6 and resistance 7.

Curve A illustrates the non-linear current-voltage characteristic of a typical narrow junction diode such as may be used in the practice of this invention. The linear characteristic of resistance 7 is shown by the straight line B. As shown by its current-voltage characteristic, such a narrow junction diode has a characteristic peak current and a region of strong negative resistance at low forward voltages. By suitable selection of semiconductor material, method of fabrication and control of the physical properties of the narrow junction degenerate semiconductor diode a family of devices are available having a wide range of peak current values varying from the milliampere range to in excess of hundreds of amperes. A narrow junction degenerate semiconductor diode, therefore, may readily be selected having the desired value of peak current to correspond to the magnitude of the current to be sensed.

Resistance 7, connected in parallel with narrow junction diode 6, has an impedance sufficiently high to establish a load line C having a slope which provides for two stable conditions of operation corresponding to different voltage conditions of diode 6. The slope of load line C is determined by resistance 7, being equal to $1/R$, where R is the value of resistance 7 in ohms. The value of resistance 7 is selected such that at diode voltages below the voltage corresponding to the characteristic peak current of the particular diode, it is higher than the impedance of the diode, but lower than the impedance of the diode at diode voltages above the voltage corresponding to the characteristic peak current of the particular diode. As used herein "diode voltage" refers to the voltage between the terminals of the diode.

Since diode 6 and resistance 7 are in parallel circuit relation, the current will divide and flow through them in the inverse ratio of their impedances. Therefore, at currents below the peak current of the diode, resistance 7 has a higher impedance than the impedance of diode 6 and the greater amount of current will flow in direction from contact 2 through inductance element 1, and diode 6 to the other side of the source.

When the diode voltage exceeds the value which corresponds to the peak current of diode 6, however, there is an abrupt change in the impedance of diode 6, caused by the almost instantaneous shift in the operating point of diode 6 to the other stable position, such as for example as shown at D. This abrupt change in operating point results from the fact that an operating point in the negative resistance region is not stable, and the point moves almost instantly to its stable position in the positive resistance region. The impedance of diode 6 is now much greater than that of resistance 7 and the greater current now flows through the resistance. This is shown clearly in FIG. 2 where, for the current and voltage value corresponding to point D, for example, the current through resistance 7 is shown at E and the current through diode 6 is shown at D.

Figure 5:
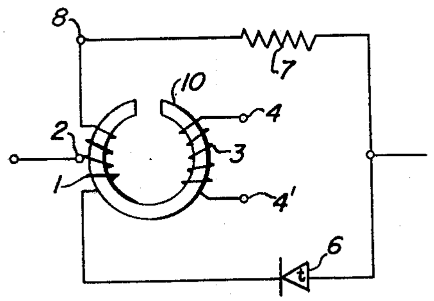
FIG. 5 is a schematic illustration of another embodiment of this invention.

When the peak current of diode 6 has been reached and the diode switches to the other stable operating point the direction of the greater current flow in the first inductive element 1, also changes. For example, after switching, the greater amount of current flows in a direction from contact 2 through inductance element 1 and resistance 6. The resulting reversal of current through inductance element 1 causes a reversal of magnetic flux in the core material rather than merely a change and this produces a much larger output in inductance element 3. The magnitude of the output is determined by the usual factors as the number of primary and secondary turns, type of core material and the quantity of core material used. Oftentimes an air core transformer, as designated at 10 in FIG. 5, is used to advantage. The embodiment of FIG. 5 is otherwise similar in construction and operation to the embodiment of FIG. 1 and like components are similarly numbered.

Alternatively, the current source, whose threshold value is to be sensed, may be connected to the junction 8 of inductance element 1 and resistor 7 rather than at center tap 2 of inductance 1. Under this condition an output will result whenever the diode peak current has been reached, as before, but, since there is no reversal of the current through inductance element 1, the output is not as large. Where the higher output is not required, therefore, in a particular application an even simpler sensing circuit is provided which has the same sensitivity and stability as the circuit of FIG. 1.

By suitable selection, the operating point for a desired value of current can be established very near the peak current of the diode. Under this condition a very slight increase in current from the selected threshold value causes the diode peak current to be reached causing the diode to switch, producing an output at terminals 4—4' of inductance element 3. The circuit can, therefore, be made extremely sensitive.

When the current source is alternating current, for example, during each cycle of the current which causes the peak current of the diode to be reached, there will be an output. Under this condition there will be one pulse produced by the switching of the diode from its low impedance condition to its high impedance condition on the positive portion of the cycle of the alternating current to be sensed and another pulse due to the resetting of the diode to its low impedance condition as the current to be sensed moves toward the negative portion of its cycle.

Figure 3:
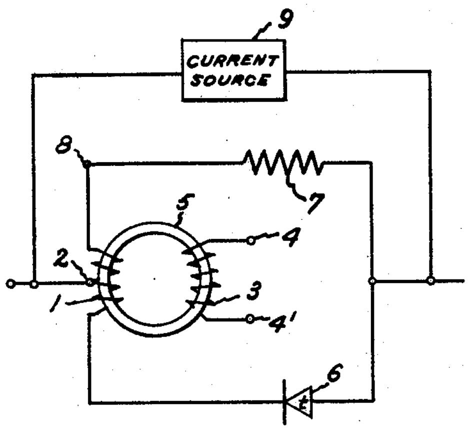
FIG. 3 is a schematic illustration of another embodiment of this invention.

FIG. 3 shows another embodiment of this invention in a tolerance limit circuit for alternating current. This embodiment may be utilized, for example, to differentiate between a number of different distinct current levels if desired.

Figure 4:
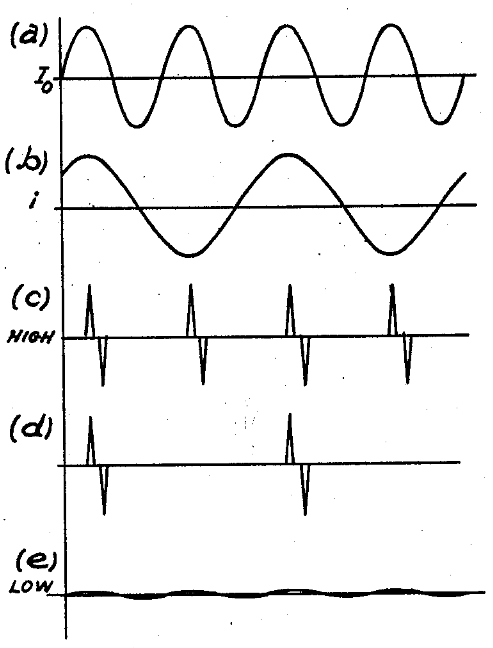
FIG. 4 illustrates current and voltage wave forms at various points in the circuit of FIG. 3.

The circuit of FIG. 3 utilizes a varying bias current superimposed on the current to be sensed such as by a slowly varying current source 9. The operation of the tolerance circuit may best be described by reference to the wave forms shown in FIG. 4. By way of example only, the frequency of the bias current produced by current source 9 is shown as one-half the frequency of the current to be sensed. When the frequency of the two currents is in this ratio a tolerance limit sensing circuit results which is capable of distinguishing between two distinct values of current. The bias current, however, may be either of a higher or lower frequency if sensing of more than two distinct values of current is desired.

When the current to be sensed, shown by FIG. 4*a*, has superimposed upon it the bias current from current source 9, shown in FIG. 4*b*, the positive portions of the cycle are alternately enhanced and inhibited thereby.

The operation of the tolerance limit circuit of FIG. 3 will be described in detail hereinbelow particularly with respect to the sensing of two distinct values of current. For this condition, therefore, the frequency of the current, from bias current source 9, is one half the frequency of the current to be sensed.

Assume initially that it is desired to sense the current values at a predetermined value above and below a value designated herein as $I_0$. The peak current from alternating current source 9 will then be designated as I.

The circuit parameters are selected such that when the current I in bias current source 9 is equal to zero the characteristic peak current of the diode is just reached and the diode switches when the current to be sensed has a value equal to $I_0$. This output is shown at FIG. 4*d* and represents an output at every other cycle of the current to be measured.

Reference to the wave forms of FIGS. 4*a* and 4*b* shows that because of the alternately enhancing and inhibiting of the current to be sensed there will be established two tolerance limits. One tolerance limit results when the current to be sensed reaches a value such that, when enhanced by the bias current from source 9, the peak current of diode 6 is just still reached causing it to switch and an output results. Any lower value of the current to be sensed, therefore, will not cause switching.

The other tolerance limit results when the current to be sensed increases above the value $I_0$ to such an extent that even though inhibited by the current from source 9, as shown in FIGS. 4*a* and 4*b*, the diode peak current is reached and an output is produced.

This results in an output such as shown by the wave forms of FIG. 4*d* for values of current within the two tolerance limits. With a frequency ratio as shown this results in an output every other cycle. For values of current above the upper tolerance limit an output results every cycle as shown in FIG. 4*c*. When the current to be sensed falls to a value below the lower tolerance limit no switching results and only an extremely small output is produced.

This variation in the output above and below the two tolerance limits gives an indication as to whether the current to be sensed is above, below or within the selected limits. In addition, the output may be utilized as a control signal if desired.

One circuit constructed in accord with the present invention utilized the following parameters, which are given by way of example only:

| | |
|---|---|
| Inductance element **1** | 40 micro henries. |
| Inductance element **3** | 40 micro henries. |
| Core **5** | A cylinder of ferromagnetic material having an outside diameter of 1 inch, an inside diameter of ¼ inch and a length of 2 inches. |
| Diode **6** | Narrow junction degenerate semiconductor diode having a peak current of 160 ma. |
| Resistance **7** | 2 ohms. |

The center tap 2 of inductance element 1 was connected to a variable source of alternating current. The output terminals 4—4' of inductance element 3 were connected to an oscilloscope. As the current was increased from zero there was substantially no output until a value was reached which produced two small pulses on the scope. As the current was increased beyond this level the pulses remained and the period between one positive pulse to the next remained constant, indicating an output at the same level of current at all times.

While only certain preferred features of the invention have been shown by way of illustration, many modifications and changes will occur to those skilled in the art and it is, therefore, to be understood that the appended claims are intended to cover all such modifications and changes as fall within the true spirit and scope of the invention.

What I claim as new and desire to secure by Letters Patent of the United States is:

1. A sensing circuit responsive to a predetermined electrical condition in a circuit to be sensed comprising: a circuit loop including a narrow junction degenerate semiconductor diode having a characteristic peak current, first and second stable impedance conditions, and exhibiting a negative resistance region in the low forward voltage range of its current-voltage characteristic; a resistance; and a first inductance element: a second inductance element inductively coupled with said first inductance element and adapted to provide an electrical output: and means for connecting a circuit, an electrical characteristic of which is to be sensed, between the juncture of said diode and said resistance on one hand and an intermediate portion on said first inductance element on the other hand, said resistance having a value so that at diode voltages below the voltage corresponding to the peak current of said diode on its current-voltage characteristic the diode exhibits a lower impedance to current flow than said resistance but at diode voltages higher than the voltage corresponding to said peak current the impedance of said diode is large as compared with that of said resistance element whereby upon the occurrence of a current through said diode equal to the peak current thereof the device abruptly switches from a first stable low impedance condition to a second stable high impedance condition causing a change of current in said first inductance element and an output at said second inductance element.

2. A sensing circuit responsive to a predetermined electrical condition in a circuit to be sensed comprising: a circuit loop including a narrow junction degenerate semiconductor diode having a characteristic peak current, first and second impedance conditions, and exhibiting a negative resistance region in the low forward voltage range of its current-voltage characteristic; a resistance; and a first inductive element: a second inductive element inductively coupled with said first inductance element and adapted to provide an electrical output: and means for connecting a circuit, an electrical characteristic of which is to be sensed, across said resistance and said semiconductor diode in parallel, said resistance having a value such that at diode voltages below the voltage corresponding to the peak current of said diode on its current-voltage characteristic the diode exhibits a lower impedance to current flow than said resistance but at diode voltages higher than the voltages corresponding to said peak current the impedance of said diode is large as compared with that of said resistance element whereby upon the occurrence of a current through said diode equal to the peak current thereof the diode abruptly switches from a first stable low impedance condition to a second stable high impedance condition causing a change of current in said first inductance element and an output at said second inductance element.

3. A sensing circuit responsive to a predetermined electrical condition in a circuit to be sensed comprising: a circuit loop including a narrow junction degenerate semiconductor diode having a characteristic peak current, first and second stable impedance conditions, and exhibiting a negative resistance region in the low forward voltage range of its current-voltage characteristic; a resistance; and a first inductance element: a second inductance element inductively coupled with said first inductance element and adapted to provide an electrical output: and means for connecting a circuit, an electrical characteristic of which is to be sensed, between the juncture of said diode and said resistance on one hand and an intermediate portion on said first inductance element on the other hand, said resistance having a value of impedance intermediate said first and second stable impedance conditions of said semiconductor diode so that upon the occurrence of a current through said diode equal to the peak current thereof the device abruptly switches from a first stable low impedance condition to a second stable high impedance condition causing a change of current in said first inductance element and an output at said second inductance element.

4. A sensing circuit responsive to a predetermined electrical condition in a circuit to be sensed comprising: a circuit loop including a narrow junction degenerate semiconductor diode having a characteristic peak current, first and second stable impedance conditions, and exhibiting a negative resistance region in the low forward voltage range of its current-voltage characteristic; a resistance; and a first inductance element: a second inductance element inductively coupled with said first inductance element and adapted to provide an electrical output: and means for connecting a circuit, an electrical characteristic of which is to be sensed, across said resistance and said semiconductor diode in parallel, said resistance having a value intermediate said first and second impedance conditions of said semiconductor dode, so that upon the occurrence of a current through said diode equal to the peak current thereof the diode abruptly switches from said first stable low impedance condition to said second stable high impedance condition causing a change of current in said first inductance element and an output at said second inductance element.

5. A sensing circuit responsive to a predetermined electrical condition in a circuit to be sensed comprising: an inductance device including a coupling body of a material having high magnetic permeability, a first winding magnetically coupled with said body having a point intermediate the ends thereof for electrical connection; and a second winding magnetically coupled with said body and adapted to provide an electrical output: a circuit loop including said first winding; a narrow junction degenerate semiconductor diode having a characteristic peak current, first and second impedance conditions, and exhibiting a negative resistance region in the low forward voltage range of its current-voltage characteristic; and a resistance: and means for connecting a circuit, an electrical characteristic of which is to be sensed, to said intermediate point of said first winding and across said resistance and said semiconductor diode in parallel, said resistance having a value intermediate said first and said second impedance conditions of said semiconductor diode so that with the occurrence of current through said diode equal to the peak current thereof the diode abruptly switches from a first stable low impedance condition to a second stable high impedance condition causing a change of current in said first electric circuit element coupled to said body and an output at said second circuit element coupled to said body.

6. The sensing circuit of claim 5 wherein said inductance device is an iron core transformer.

7. The sensing circuit of claim 5 wherein the inductance device is an air core transformer.

References Cited in the file of this patent

UNITED STATES PATENTS

| | | |
|---|---|---|
| 2,693,572 | Chase | Nov. 2, 1954 |
| 2,843,765 | Aigrain | July 15, 1958 |

OTHER REFERENCES

Publication: Radio-Electronic Engineering, April 1953, pp. 8 to 10.